United States Patent
Einfeldt et al.

(10) Patent No.: US 9,768,356 B2
(45) Date of Patent: Sep. 19, 2017

(54) METHOD FOR FORMING A METAL CONTACT ON A SURFACE OF A SEMICONDUCTOR, AND DEVICE WITH A METAL CONTACT

(71) Applicant: FORSCHUNGSVERBUND BERLIN E.V., Berlin (DE)

(72) Inventors: Sven Einfeldt, Berlin (DE); Luca Redaelli, Berlin (DE); Michael Kneissl, Berlin (DE)

(73) Assignee: Forschungsverbund Berlin E.V., Berlin (DE)

( * ) Notice: Subject to any disclaimer, the term of this patent is extended or adjusted under 35 U.S.C. 154(b) by 0 days.

(21) Appl. No.: 15/105,541

(22) PCT Filed: Dec. 17, 2014

(86) PCT No.: PCT/EP2014/078189
§ 371 (c)(1),
(2) Date: Jun. 16, 2016

(87) PCT Pub. No.: WO2015/091626
PCT Pub. Date: Jun. 25, 2015

(65) Prior Publication Data
US 2016/0322538 A1 Nov. 3, 2016

(30) Foreign Application Priority Data
Dec. 17, 2013 (DE) .......... 10 2013 226 270

(51) Int. Cl.
*H01L 33/40* (2010.01)
*H01L 21/285* (2006.01)
(Continued)

(52) U.S. Cl.
CPC ........ *H01L 33/40* (2013.01); *H01L 21/28575* (2013.01); *H01L 29/452* (2013.01);
(Continued)

(58) Field of Classification Search
CPC ......... H01L 33/40; H01L 33/38; H01L 33/32; H01L 33/58; H01L 33/36; H01L 29/452;
(Continued)

(56) References Cited

U.S. PATENT DOCUMENTS

| 5,176,792 A | 1/1993 | Fullowan et al. |
| 6,433,436 B1 | 8/2002 | Feild et al. |
| 2012/0146047 A1* | 6/2012 | Kneissl .................. H01L 33/46 257/76 |

FOREIGN PATENT DOCUMENTS

| DE | 10 2009 034 359 A1 | 2/2011 |
| EP | 0 889 519 A2 | 1/1999 |

* cited by examiner

*Primary Examiner* — Selim Ahmed
(74) *Attorney, Agent, or Firm* — Lewis Roca Rothgerber Christie LLP

(57) ABSTRACT

A method is described for forming at least one metal contact on a surface of a semiconductor and a device with at least one metal contact. The method is used for forming at least one metal contact (60) on a surface (11) of a semiconductor (10) and has the steps of: applying a metal layer (20) of palladium onto the semiconductor surface (11), applying a mask (40, 50) onto the metal layer (20), and structuring the palladium of the metal layer (20) using the mask (40, 50), wherein lateral deposits (21) of the metal are formed on sidewalls of the mask by the structuring so that the mask is embedded between the deposits (21) and the structured metal layer (20') after the structuring. Since the mask is conductive, it can remain embedded in the metal. The deposits and the mask form a part of the contact.

8 Claims, 2 Drawing Sheets

(51) Int. Cl.
*H01L 29/45*    (2006.01)
*H01S 5/22*     (2006.01)
*H01L 33/36*    (2010.01)
*H01S 5/323*    (2006.01)
*H01L 33/32*    (2010.01)
*H01L 33/38*    (2010.01)
*H01L 33/58*    (2010.01)
H01L 29/20      (2006.01)
H01S 5/042      (2006.01)
H01L 33/00      (2010.01)

(52) U.S. Cl.
CPC .............. *H01L 33/32* (2013.01); *H01L 33/36* (2013.01); *H01L 33/38* (2013.01); *H01L 33/58* (2013.01); *H01S 5/22* (2013.01); *H01S 5/32341* (2013.01); H01L 29/2003 (2013.01); H01L 33/0075 (2013.01); H01L 2933/0016 (2013.01); H01S 5/0425 (2013.01)

(58) Field of Classification Search
CPC ........... H01L 21/28575; H01L 33/0075; H01L 2933/0016; H01L 29/2003; H01S 5/32341; H01S 5/22; H01S 5/0425
See application file for complete search history.

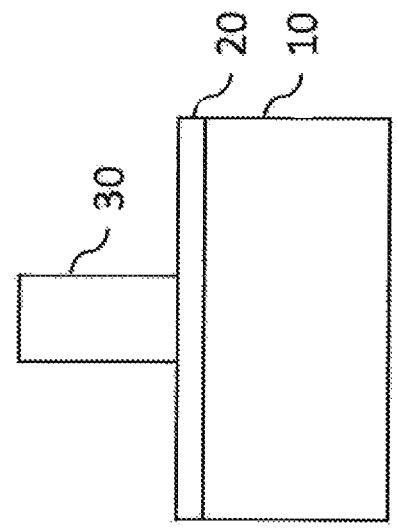
Figure 2 – prior art
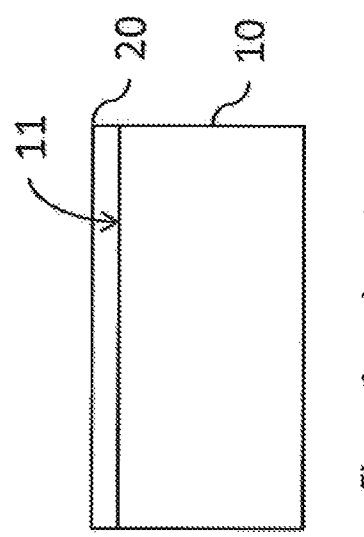
Figure 1 – prior art
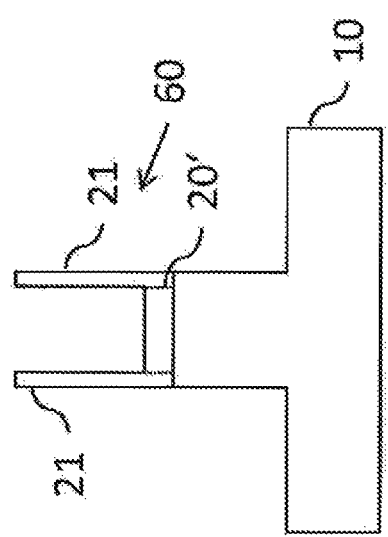
Figure 3 – prior art

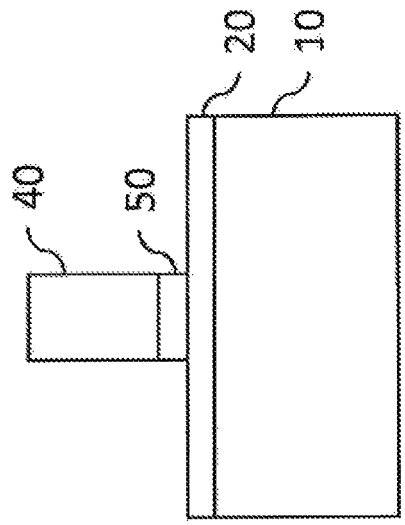
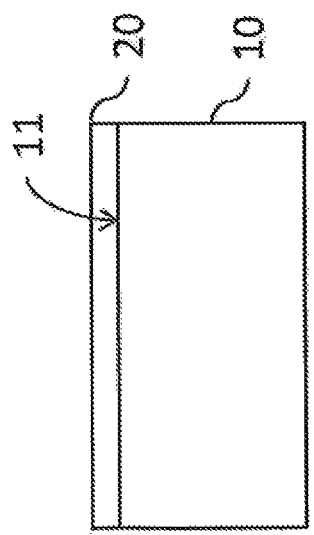
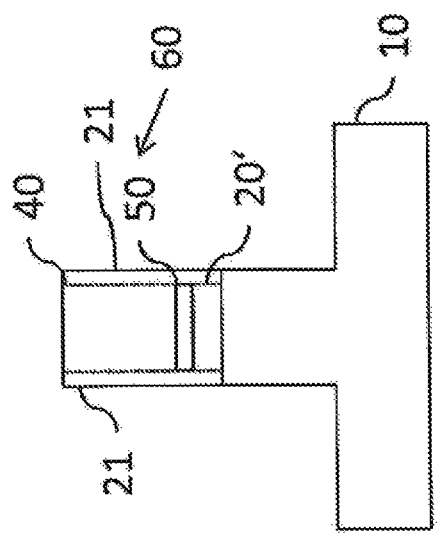

METHOD FOR FORMING A METAL CONTACT ON A SURFACE OF A SEMICONDUCTOR, AND DEVICE WITH A METAL CONTACT

CROSS-REFERENCED TO RELATED APPLICATION(S)

This Application is a National Phase Patent Application of, and claims priority to and the benefit of International Application Number PCT/EP2014/078189, filed Dec. 17, 2014, which claims priority to and the benefit of German Application Number 10 2013 226 270.1, filed Dec. 17, 2013, the entire contents of all of which are incorporated herein by reference.

The invention relates to a method for forming at least one metal contact on a surface of a semiconductor and to a device with at least one metal contact.

Semiconductors, for example of GaN, gallium nitride, are used in various technical fields. An example is the use of epitaxial semiconductor wafers for manufacturing ridge waveguides for a laser diode.

Many of these applications require metal contacts on a surface of the semiconductor. Here, resistance values of such metal contacts depend sensitively upon impurities and/or crystal defects and/or the stoichiometry of the semiconductor surface at the time of the application of the respective metal contact. The stoichiometry of the semiconductor surface can change, particularly during the processing of the semiconductor.

In order to leave the resistance values of the metal contacts unaffected therefrom, a layer of the respective metal is deposited onto the semiconductor surface before each other processing of the semiconductor and is structured subtractively by means of a mask. If the metal contacts consist of a noble and chemically very inert metal, a dry etching method, for example sputter etching, reactive-ion etching (RIE), inductively coupled plasma (ICP) etching, or chemically assisted ion beam etching (CAIBE), is required for this purpose.

In such dry etching methods, a part of the removed metal deposits again on the surface as well as on the surface and the edges of the mask in the course of the redeposition. After removing the mask, the metal redeposited at the edges of the mask remains as a kind of fence. This fence is difficult to remove and can cause the formation of cavities in the course of the deposition which, in turn, can affect the reliability of the component including the semiconductor by obstructing the heat transport.

The formation of the fences according to the prior art is exemplified in FIGS. 1 to 3. FIG. 1 shows the unstructured semiconductor 10 of GaN with a metal layer 20 of Pd, palladium, on a surface 11 of the semiconductor 10. As shown in FIG. 2, a mask 30, for example a hard mask of $SiN_x$, is applied. Then, the metal layer 20 is structured by means of sputter etching, for example with argon. Subsequently, the semiconductor 10 is structured by plasma etching, for example with chlorine, using the same mask. Subsequently, residues of the mask are removed. There remains the structure with deposits 21 which were deposited laterally at the mask and protrude upwards over the structured metal layer 20' after the removal of the mask, as shown in FIG. 3.

The removal of the mask is carried out wet-chemically using hydrofluoric acid, for example.

A method for forming a structured tungsten layer by means of a titanium mask is described in U.S. Pat. No. 5,176,792. EP 0 889 519 A2 is concerned with an electrode structure for a capacitor. A platinum electrode is etched by means of a Ti—Al—N hard mask, the redeposition of the platinum during the etching leading to the formation of transient side wall fences. U.S. Pat. No. 6,433,436 B1 illustrates the fabrication of a multi-level-interconnect structure in a combined etching process in one step. DE 10 2009 034 359 A1 relates to a palladium-based p-contact for a light emitting diode, especially a nano-pixel LED based on GaN.

The object of the present invention is to provide a method by which a reliably functioning metal contact can be formed on a surface of a semiconductor.

This object is achieved by the method according to claim 1. The method is used for forming at least one metal contact on a surface of a semiconductor made of gallium nitride and comprises the steps of: applying a metal layer of palladium onto the semiconductor surface, applying a mask onto the metal layer, and structuring at least the metal layer using the mask, wherein lateral deposits of the metal of the metal layer are produced on the mask by the structuring so that the mask is embedded between the deposits and the structured metal layer after the structuring. The method is characterized in that the mask is a conductive hard mask, wherein the structuring also structures the semiconductor and comprises the following steps: sputter etching the metal with argon, and plasma etching the semiconductor with chlorine.

Since the mask is conductive, it can serve as a lost mask, and it is not necessary to remove the mask and the lateral deposits so that no surface section of the metal contact is concave. The deposits and the lost mask form a part of the contact.

In an advantageous embodiment, the mask includes at least one conductive material different from the metal. In this case, the different material can form a lowermost layer of the hard mask. Further, the hard mask of said advantageous embodiment includes a layer made of the metal which is arranged on the different material.

As a result of the structuring, the metal encloses the different material so that the conductivity of the contact is only minimally influenced by the presence of the material in the contact.

The conductive material can include, for example, titanium, nickel or chromium.

The semiconductor can be an epitaxial semiconductor. The metal contact can be a part of a ridge waveguide. The metal contact can also be a mesa structure on a p-side of a micro-pixel LED or a nano-pixel LED.

According to the invention, a device according to claim 7 with at least one metal contact on a surface of a structured gallium nitride semiconductor is further proposed. The device is characterized in that the metal contact comprises a conductive hard mask material on a correspondingly structured palladium layer and between palladium deposits, wherein all surface sections of the metal contact are convex or flat. That is, no surface section of the metal contact is concave.

The invention is described below in exemplary embodiments with reference to the associated drawings. In the drawings:

FIGS. 1, 2 and 3 show schematically different states of a semiconductor during a method for forming a metal contact according to the prior art, and FIGS. 4, 5 and 6 show schematically different states of a semiconductor during a method for forming a metal contact according to an exemplary embodiment of the invention.

FIG. 4 shows the unstructured semiconductor 10 of GaN with a metal layer 20 of Pd, palladium, on a surface 11 of the semiconductor 10. The unstructured semiconductor 10 of the example is an epitaxial semiconductor, but the present invention develops its technical effect also for other semiconductors and is not limited to epitaxial semiconductors.

As shown in FIG. 5, a conductive hard mask 40, 50 which includes a lowermost layer 50 of Ti, titanium is applied. Other conductive materials different from palladium are Ni, nickel, and Cr, chromium. An uppermost layer 40 which is arranged on the lowermost layer 50 also consists of palladium. The uppermost layer 40 is optional and, in the example, considerably thicker than the metal layer 20. In the example, there are only two layers present so that the uppermost layer 40 is arranged directly on the lowermost layer 50. However, further conductive layers are possible in the sense of the invention. When only one layer is used, it is the more advantageous the more similar the electrical properties of the different conductive material are to that of the metal. Particularly, the hard mask can also consist of the metal of the metal layer 20.

Then, the metal layer 20 is structured by sputter etching, for example with argon, i. e., is removed in the non-masked area. Here, the uppermost layer 40 is removed correspondingly, but since it is thicker than the metal layer 20, a residue from the uppermost layer 40 remains when the metal layer 20 is already completely removed in the non-masked area.

The metal removed in the non-masked area and from the surface of the uppermost layer 40 deposits laterally at the structured metal layer 20' and at the layers 40 and 50 of the mask in form of deposits 21 of the metal.

Subsequently, the semiconductor 10 is structured by means of plasma etching, for example with chlorine, using the same mask.

As shown in FIG. 6, the deposits 21 and the layers 20' and 50 enclose the different conductive material of the layer 40. The residues of the hard mask, i.e., the residues of the layer 50 and the layer 40, are all conductive and can be used as a part of the contact so that neither the mask nor the deposits have to be removed. Thus, no surface section of the metal contact is produced which is concave. Additionally, the method proposed according to the invention requires fewer method steps. The contact can easily be contacted via the surface of the residue of the layer 40, and the cavity between the deposits 21 is filled so that it is not necessary to remove the deposits 21. Thus, the device proposed according to the invention is more reliable and more functional.

Metal contacts in the sense of the invention can be used advantageously for various applications. For example, the metal contact can be a part of a ridge waveguide. For example, it is also possible for the metal contact to be a mesa structure on a p-side of a micro-pixel LED or a nano-pixel LED.

In an exemplary embodiment, the metal contact comprises a conductive hard mask material on a correspondingly structured palladium layer and between palladium deposits, wherein all surface sections of the metal contact are convex or flat. That is, in this exemplary embodiment, no surface section of the metal contact is concave.

The invention claimed is:

1. A method for forming at least one metal contact (60) on a surface (11) of a semiconductor (10) made of gallium nitride, comprising the steps of:
    applying a metal layer (20) of palladium onto the semiconductor surface (11),
    applying a mask (40, 50) onto the metal layer (20), and
    structuring at least the metal layer (20) using the mask (40, 50), wherein lateral deposits (21) of the metal of the metal layer are formed on sidewalls of the mask by the structuring so that the mask is embedded between the deposits (21) and the structured metal layer (20') after the structuring,
    characterized in that
    the mask is a conductive hard mask, wherein the structuring also structures the semiconductor (10) and comprises the following steps: sputter etching the metal layer (20) with argon, and plasma etching the semiconductor (10) with chlorine.

2. The method according to claim 1, wherein the mask includes at least one conductive material (50) different from the metal layer, and wherein the at least one conductive material (50) forms a lowermost layer of the hard mask and the hard mask further includes a layer (40) made of the metal layer of palladium which is arranged on the at least one conductive material (50).

3. The method according to claim 2, wherein the conductive material (40) includes titanium, nickel or chromium.

4. The method according to claim 1, wherein the semiconductor (10) is epitaxial.

5. The method according to claim 1, wherein the metal contact (60) is a part of a ridge waveguide.

6. The method according to claim 1, wherein the metal contact (60) is a mesa structure on a p-side of a micro-pixel LED or a nano-pixel LED.

7. A device with at least one metal contact (60) on a surface (11) of a structured gallium nitride semiconductor (10), wherein the metal contact comprises a conductive hard mask material on a correspondingly structured palladium layer (20') and the conductive hard mask material is between the structured palladium layer and between palladium deposits (21) that are on the sidewalls of the conductive hard mask material, wherein no surface section of the metal contact (60) is concave.

8. A device according to claim 7, wherein all surface sections are flat.

* * * * *